United States Patent
Lin

(10) Patent No.: US 9,078,337 B2
(45) Date of Patent: Jul. 7, 2015

(54) PLASMA-GENERATING DEVICE

(71) Applicant: TAMKANG UNIVERSITY, New Taipei (TW)

(72) Inventor: I-Nan Lin, Taipei (TW)

(73) Assignee: Tamkang University, New Taipei (TW)

( * ) Notice: Subject to any disclaimer, the term of this patent is extended or adjusted under 35 U.S.C. 154(b) by 14 days.

(21) Appl. No.: 14/099,275

(22) Filed: Dec. 6, 2013

(65) Prior Publication Data

US 2014/0097740 A1    Apr. 10, 2014

Related U.S. Application Data

(63) Continuation-in-part of application No. 13/356,963, filed on Jan. 24, 2012, now abandoned.

(30) Foreign Application Priority Data

Jun. 24, 2011  (TW) ................................ 100122225
Jun. 6, 2013   (TW) ................................ 102120111

(51) Int. Cl.
*H05H 1/48*   (2006.01)
*C23C 16/02*  (2006.01)
*C23C 16/27*  (2006.01)

(52) U.S. Cl.
CPC .............. *H05H 1/48* (2013.01); *C23C 16/0272* (2013.01); *C23C 16/274* (2013.01)

(58) Field of Classification Search
None
See application file for complete search history.

(56) References Cited

U.S. PATENT DOCUMENTS

| | | | | |
|---|---|---|---|---|
| 5,352,266 A * | 10/1994 | Erb et al. | | 75/300 |
| 6,008,569 A * | 12/1999 | Yamanobe | | 313/310 |
| 6,592,839 B2 | 7/2003 | Gruen et al. | | |
| 6,867,548 B2 | 3/2005 | Eden et al. | | |
| 2001/0024078 A1 * | 9/2001 | Dimitrijevic et al. | | 313/311 |
| 2008/0191598 A1 * | 8/2008 | Yang et al. | | 313/310 |
| 2009/0127102 A1 * | 5/2009 | Lee et al. | | 204/192.38 |
| 2011/0287223 A1 * | 11/2011 | Victor et al. | | 428/147 |

FOREIGN PATENT DOCUMENTS

TW    1312476    8/2009

OTHER PUBLICATIONS

Wang et al. Origin of platelike granular structure for the ultrananocrystalline diamond films synthesized in—containing plasma. J. Appl. Phys. 107, 034304 (2010).
Wang et al. Growth behavior of nanocrystalline diamond films on ultrananocrystalline diamond nuclei: The transmission electron microscopy studies. J. Appl. Phys. 105, 124311 (2009).

(Continued)

*Primary Examiner* — Ashok Patel
(74) *Attorney, Agent, or Firm* — The Webb Law Firm

(57) ABSTRACT

A plasma-generating device includes an anode plate and a cathode plate spaced apart from the anode plate. The cathode plate includes a substrate and a hybrid diamond layer formed on the substrate. The hybrid diamond layer includes ultra-nanocrystalline diamond grains, an amorphous carbon disposed among and bonded to the ultra-nanocrystalline diamond grains, micro-crystalline diamond grains disposed among the ultra-nanocrystalline diamond grains, and a graphite phase disposed among the ultra-nanocrystalline diamond grains. Each of the micro-crystalline diamond grains is surrounded by the graphite phase.

7 Claims, 15 Drawing Sheets

(56) References Cited

OTHER PUBLICATIONS

Wang et al. Sythesis of diamond using ultra-nanocrystalline diamonds as seeding layer and their electron field emission properties. Diamond and Related Material 18 (2009), 136-140.

Sankaran et al. Investigation in the role of hydrogen on the properties of diamond films grown using Ar/H2/CH4 microwave plasma. Diamond and Related Materials 20 (2011), 232-237.

Cheng et al. Modification on the Microstructure of Ultrananocrystalline Diamond Films for Enhancing Their Electron Field Emission Properties via a Two-Step Microwave Plasma Enhanced Chemical Vapor Deposition Process Phys. Chem. C 2011, 115, 13894-13900.

Cheng et al.; "Enhanced electron field emission properties by tuning the microstructure of ultrananocrystalline diamond film"; Journal of Applied Physics; 2011; pp. 033711-1-033711-8; vol. 109.

\* cited by examiner

US 9,078,337 B2

PLASMA-GENERATING DEVICE

CROSS-REFERENCE TO RELATED APPLICATION

This application is a continuation-in-part (CIP) of co-pending U.S. patent application Ser. No. 13/356,963, filed on Jan. 24, 2012, the entire disclosure of which is incorporated herein by reference. This application also claims priority of Taiwanese application no. 102120111, filed on Jun. 6, 2013.

BACKGROUND OF THE INVENTION

1. Field of the Invention

This invention relates to a plasma-generating device including a diamond layer having a graphite phase and/or a graphite precipitate layer.

2. Description of the Related Art

Diamond and its related materials are used in many technical fields due to their specific physical and chemical characteristics. Besides, because a diamond film has excellent electron field emission (EFE) property, it is beneficial to serve as a material for forming field emission emitters. In recent decades, many efforts have been devoted to study the growth, characteristics and applications of single-crystalline and microcrystalline diamond (MCD).

A method for fabricating a diamond film has been proposed by the inventors of this application (see "Growth behavior of nanocrystalline diamond films on ultra nanocrystalline diamond nuclei: The transmission electron microscopy studies," Journal of Applied Physics 105, 124311 (2009)). The method includes: (A) disposing an n-type silicon substrate in a microwave plasma enhanced chemical vapor deposition (MPECVD) system under $Ar/CH_4$ plasma condition, in which the volume percentage of $CH_4$ is 1%, and performing a MPECVD process for 20 minutes so as to form a seed layer having a plurality of ultra-nanocrystalline diamond (UNCD) grains on the silicon substrate; and (B) disposing the silicon substrate having the seed layer in another MPECVD system (2.45 GHz, AS-TeX 5400) and performing a MPECVD process under a working pressure of 73 mbars in a mixed gas atmosphere ($CH_4/H_4$), in which the volume percentage of $CH_4$ is 1%, for 60 minutes, so as to obtain a diamond film having a plurality of MCD grains.

The MCD grains of the diamond film have an average size of about 300 nm when observed using Scanning Electron Microscopy (SEM). When observed using Transmission Electron Microscopy (TEM), it is found that each of the MCD grains is surrounded by a plurality of UNCD grains having an average size near 10 nm. After analyzing field emission properties of the diamond film, the turn-on field ($E_0$) is about 11.1 V/µm.

The turn-on field ($E_0$) of the aforesaid diamond film is relatively high and further improvement is needed so as to meet requirements for field emission emitters.

U.S. Pat. No. 6,867,548 discloses a plasma-generating device that includes a cathode, an anode, a dielectric layer which is formed between the cathode and the anode, and a cavity which extends through the cathode and the dielectric layer. The cathode and the anode are configured to generate plasma in the cavity when a pulsed voltage is applied across the cathode and the anode. The cathode may be made of copper, aluminum, gold, silver, nickel, zinc, or a conductive polymer blended with carbon black.

Taiwan patent no. I313476 discloses a micro plasma-generating device that includes a cathode, an anode, and a micro tip formed on the cathode for tip discharging for generating plasma when a pulsed voltage is applied across the cathode and the anode. The cathode may be made of chromium.

However, metal or metal alloy, such as copper, has a low electron field emission (EFE) and/or a low hardness, which renders the same unsuitable to be used as the cathode material for the micro plasma-generating device.

SUMMARY OF THE INVENTION

Therefore, an object of the present invention is to provide a plasma-generating device that has a high electron field emission and a high hardness.

According to this invention, there is provided a plasma-generating device that comprises an anode plate and a cathode plate spaced apart from the anode plate. The cathode plate includes a substrate and a hybrid diamond layer that is formed on the substrate. The hybrid diamond layer contains a plurality of ultra-nanocrystalline diamond grains, an amorphous carbon disposed among and bonded to the ultra-nanocrystalline diamond grains, a plurality of micro-crystalline diamond grains disposed among the ultra-nanocrystalline diamond grains, and a graphite phase disposed among the ultra-nanocrystalline diamond grains. Each of the micro-crystalline diamond grains is surrounded by the graphite phase.

BRIEF DESCRIPTION OF THE DRAWINGS

In drawings which illustrate embodiments of the invention.

DETAILED DESCRIPTION OF THE PREFERRED EMBODIMENTS

Figure 1:
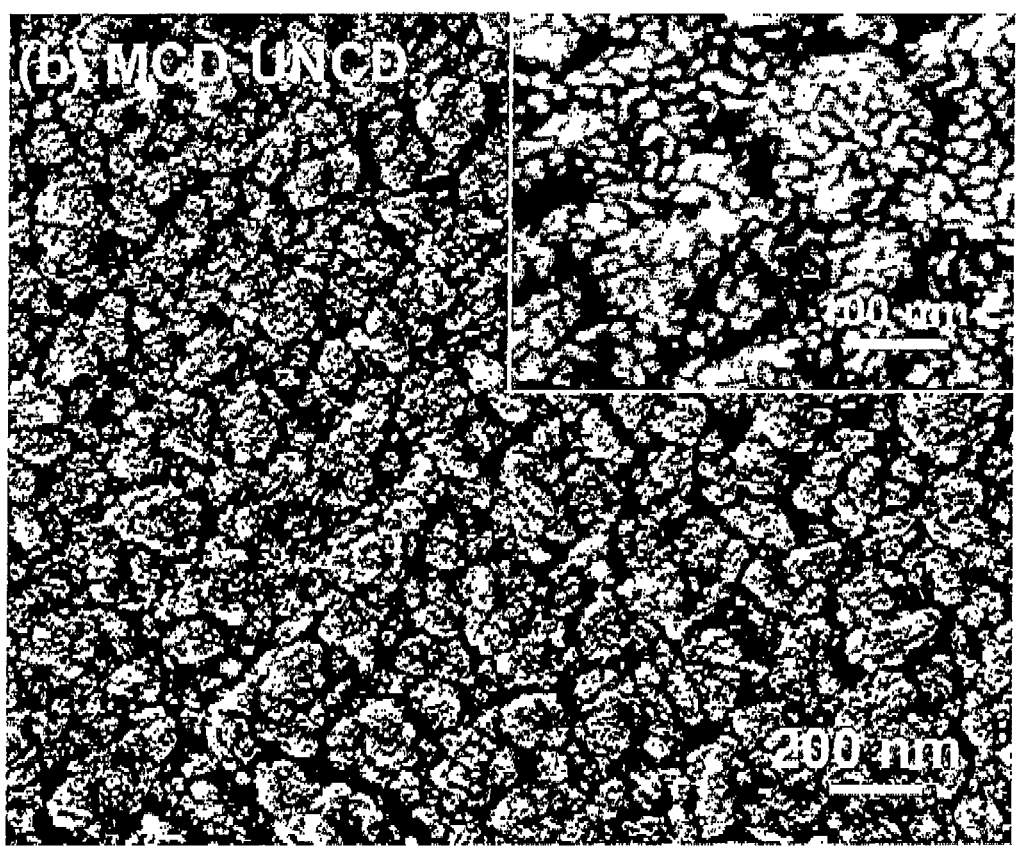
FIG. 1 is a SEM image of an example of a carbon-based composite material (Example 2) obtained using a method according to this invention.

The preferred embodiment of a method for fabricating a carbon-based composite material according to this invention includes (a) a seeding layer forming step, and (b) a crystal grains growing step.

In step (a), a seeding layer is formed over a substrate, and includes amorphous carbon matrix and a plurality of ultra-nanocrystalline diamond (UNCD) grains dispersed in the amorphous carbon matrix.

In step (b), crystal grains are grown over the seeding layer in a microwave plasma enhanced chemical vapor deposition (MPECVD) system under a hybrid plasma to obtain the carbon-based composite material of this invention. The hybrid plasma is produced by ionization of a gas mixture using the MPECVD system.

The gas mixture includes a hydrocarbon gas, $H_2$, and an inert gas in a volume ratio of 1:(99-x):x based on 100 parts of the total volume of the gas mixture, and x satisfies 45<x<55. The hydrocarbon gas is selected from the group consisting of $CH_4$, $C_2H_2$, and the combination thereof.

In step (b), amorphous carbon matrix and the UNCD grains are formed while growing the crystal grains, and a portion of the adjacent UNCD grains aggregate into a plurality of microcrystalline diamond (MCD) grains. Besides, nano-graphite clusters, which extend continuously to enable the amorphous carbon matrix to act as a material for forming field emission emitters, and which are interconnected to form a network, are formed by phase-transformed grain boundaries of parts of the MCD grains and the UNCD grains adjoining the carbon matrix.

Preferably, x satisfies 48<x<52, the inert gas is Ar gas, the hydrocarbon gas is $CH_4$, and the step (b) is conducted for 30 minutes to 90 minutes.

Preferably, the step (a) is conducted in the MPECVD system under Ar/$CH_4$ plasma condition for 30 minutes to 90 minutes.

The preferred embodiment of a carbon-based composite material is made by the above method, and includes: a carbon matrix; a plurality of MCD grains dispersed in the carbon matrix; and a plurality of UNCD grains dispersed in the carbon matrix and around the MCD grains. The carbon matrix has nano-graphite clusters that extend continuously to enable the carbon matrix to act as a material for forming field emission emitters, and that are formed by phase-transformed grain boundaries of parts of the MCD grains and the UNCD grains adjoining the carbon matrix.

It should be noted that the inert gas is also introduced into the MPECVD system in step (b). Thus, the amorphous carbon matrix and the UNCD grains are continuously formed. That is to say, the density of the UNCD grains is increased, and the likelihood of the phase transformation can be also increased. Accordingly, the nano-graphite clusters, which are formed from the phase-transformed grain boundaries of the MCD grains and the UNCD grains, have better electrical conductivity, and can serve as interconnecting channels for electrons inside the carbon matrix.

Furthermore, when the size of the UNCD grains becomes smaller, the UNCD grains are more likely to phase-transform into the nano-graphite clusters while the UNCD grains aggregate into the MCD grains. Thus, the UNCD grains preferably have a size ranging from 3 nm to 7 nm.

In this invention, the field emission (FE) mechanism may vary depending on the graphite phase portion of the carbon matrix. When the nano-graphite clusters have proper distribution and amount, it is beneficial to the FE properties of the carbon-based composite material of this invention. Because a part of the nano-graphite clusters is formed by the phase-transformed grain boundaries of parts of the MCD grains, the distribution of the nano-graphite clusters is relative to the size of the MCD grains. Accordingly, the MCD grains preferably have an average grain size of greater than 80 nm. In such condition, the nano-graphite clusters are beneficial for electron transmission and field emission.

EXAMPLES

Example 1

A carbon-based composite material of Example 1 (E1) of this invention was made according to the following steps.

An n-type silicon substrate, which has mirror-polished face (001), was subjected to ultrasonic treatment in a solution having diamond powders that have a size of about 1 nm for 30 minutes, and was ultrasonically cleaned using acetone so as to remove residual particles on the substrate.

Then, the substrate was disposed in a microwave plasma enhanced chemical vapor deposition (MPECVD) system, in which the ratio of the $CH_4$ flowing rate (in unit of sccm) to the Ar flowing rate (in unit of sccm) was 4:196 (i.e., the volume percentage of $CH_4$ was 2%). Thereafter, the MPECVD process was conducted in the system for 60 minutes to form a seeding layer on the mirror-polished face (001) of the silicon substrate. The seeding layer includes amorphous carbon matrix, and a plurality of UNCD grains dispersed in the amorphous carbon matrix.

Next, $H_2$ was introduced into the MPECVD system so that $CH_4$, $H_2$, and Ar were in a volume ratio of 1:49:50. Then, the MPECVD process was conducted for 30 minutes under a working pressure of 55 torr to grow crystal grains on the seeding layer. Finally, a carbon-based composite material was obtained.

Examples 2 and 3

The carbon-based composite materials of Examples 2 and 3 (E2 and E3) were prepared following the procedure employed in Example 1 except that, in the MPECVD process for growing the crystal grains on the seeding layer, the processing time for Examples 2 was 60 minutes and the processing time for Example 3 was 90 minutes.

Comparative Examples 1 and 2

The carbon-based composite materials of Comparative Examples 1 and 2 (CE1 and CE2) were prepared following the procedure employed in Example 2 except that, in the MPECVD system for growing the crystal grains on the seeding layer, $CH_4$, $H_2$, and Ar in Comparative Example 1 were in a volume ratio of 1:24:75, and $CH_4$, $H_2$, and Ar in Comparative Example 2 were in a volume ratio of 1:74:25.

<Data Analysis>

From FIG. 1, which shows a SEM image of the carbon-based composite material of Example 2, it is found that the MCD grains have a size ranging from 80 nm to 110 nm, and that the MCD grains are surrounded by the UNCD grains.

Figure 2:
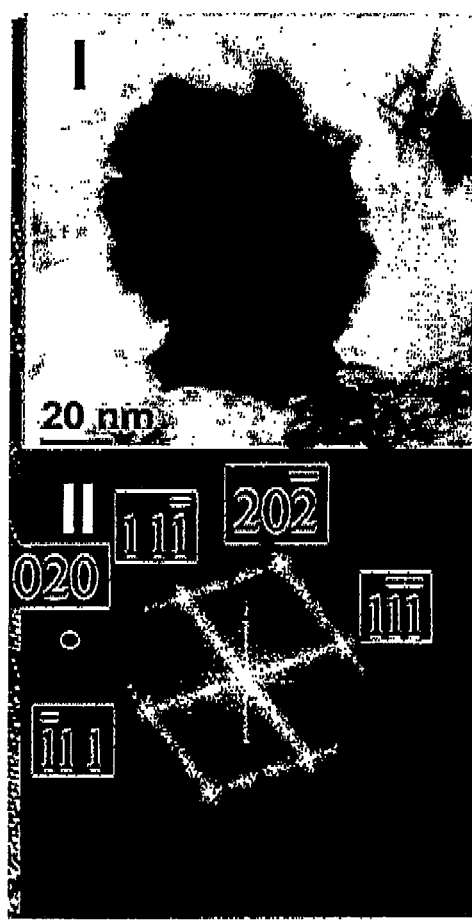
FIG. 2 shows TEM analysis results that illustrate the size and lattice structure of the microcrystalline diamond (MCD) grains of the carbon-based composite material in Example 2 of this invention.
Figure 3:
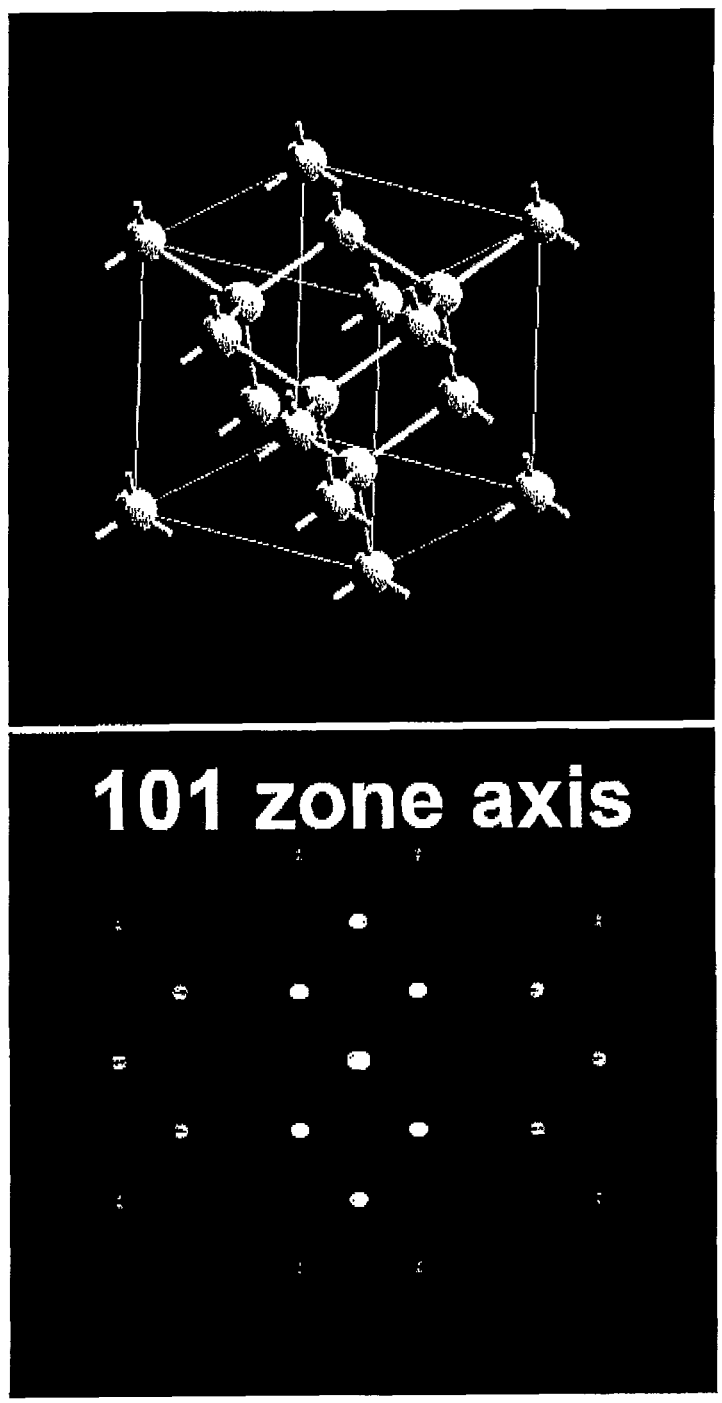
FIG. 3 shows the standard lattice structure and an electron diffraction pattern along the [101] zone axis in a single crystal diamond.

A TEM image of the carbon-based composite material of Example 2 is shown in an upper half of FIG. 2, which shows that the MCD grain has a size of about 90 nm. The lower half of FIG. 2 shows selected area electron diffraction (SAED) pattern for the MCD grains in the carbon-based composite material of Example 2, in which the pattern was obtained along the [101] zone axis. As compared to the standard lattice structure and the electron diffraction pattern along the [101] zone axis for a single crystal diamond (see FIG. 3), the MCD grains in the carbon-based composite material of Example 2 belong to a single crystal diamond with [101] axis orientation.

Figure 4:
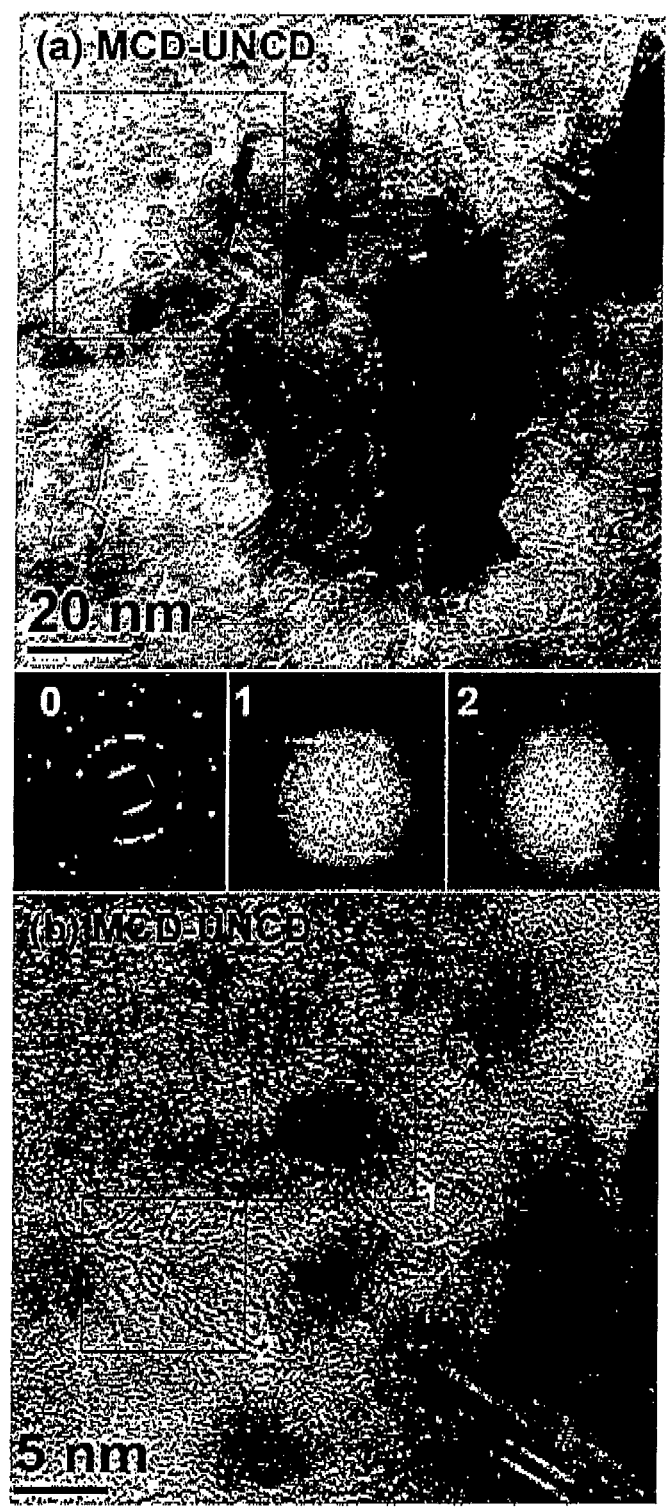
FIG. 4 shows TEM analysis results of the carbon-based composite material in Example 2 according to this invention.

The carbon-based composite material of Example 2 was subjected to TEM analysis at a position away from the [101]

zone axis of the MCD grains, and the results are shown in FIG. 4. FIG. 4(b) is an enlarged view of a marked rectangular area in FIG. 4(a). A SAED pattern of the carbon-based composite material in FIG. 4(a) is shown in picture (0) inserted in FIG. 4. It is found that all of the small particles surrounding the MCD grains are the UNCD grains. From FIG. 4(b), it is revealed that the UNCD grains have a size ranging from 3 nm to 5 nm. The Fourier-transformed (FT) diffractograms of the two marked rectangular areas 1 and 2 in FIG. 4(b) are respectively shown in pictures (1) and (2) inserted in FIG. 4. The pictures show that the area 1 has the UNCD grains, and the area 2 is the graphite phase.

Figure 5:
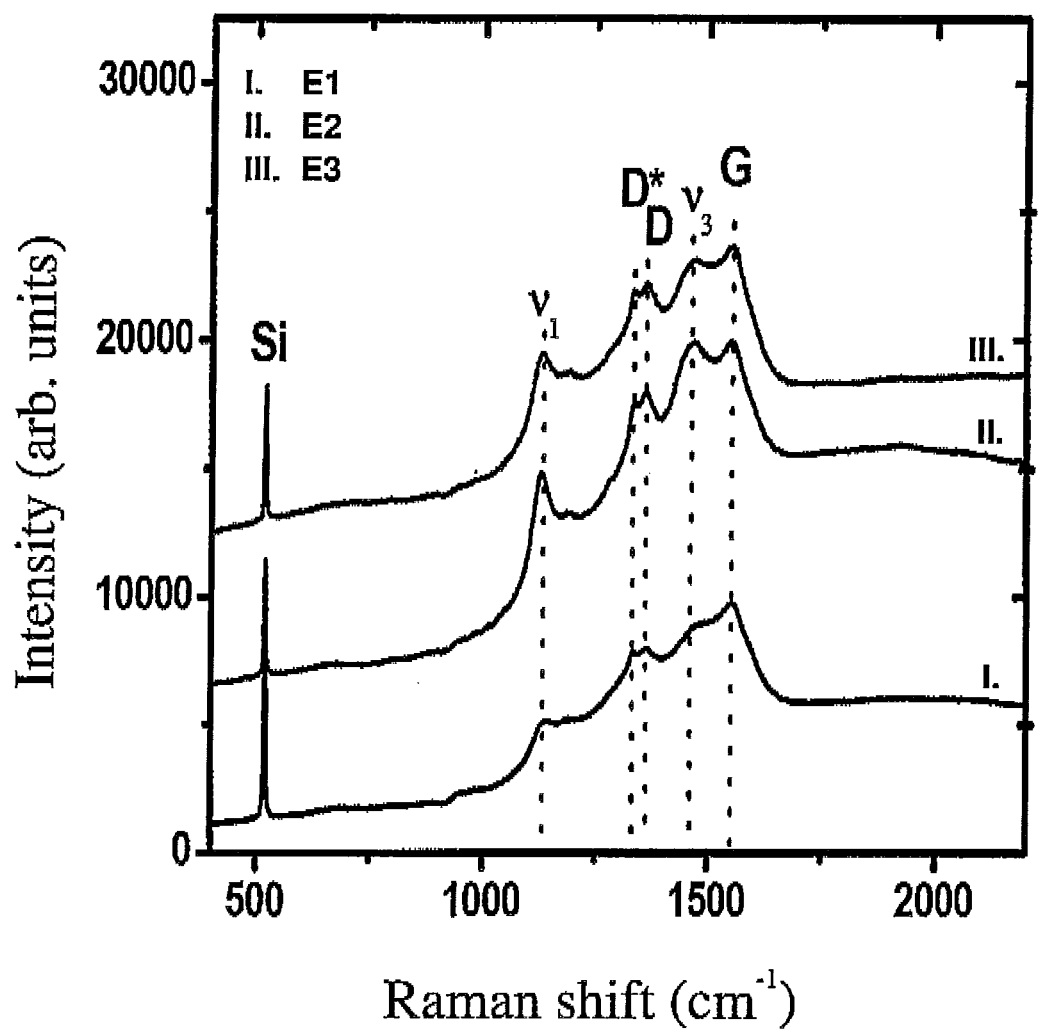
FIG. 5 shows Raman spectra of the carbon-based composite material in Examples 1 to 3 according to this invention.

From the Raman spectra shown in FIG. 5, the carbon-based composite materials in Examples 1 to 3 include: resonance peaks of $v_1$-band (1140 $cm^{-1}$) and $v_3$-band (1480 $cm^{-1}$), which represent trans-polyacetylene at the grain boundaries; resonance peaks of D*-band (1350 $cm^{-1}$) and G-band (1580 $cm^{-1}$), which represent the existence of disordered carbon and disordered graphite; and a resonance peak of D-band (1332 $cm^{-1}$).

Figure 6:
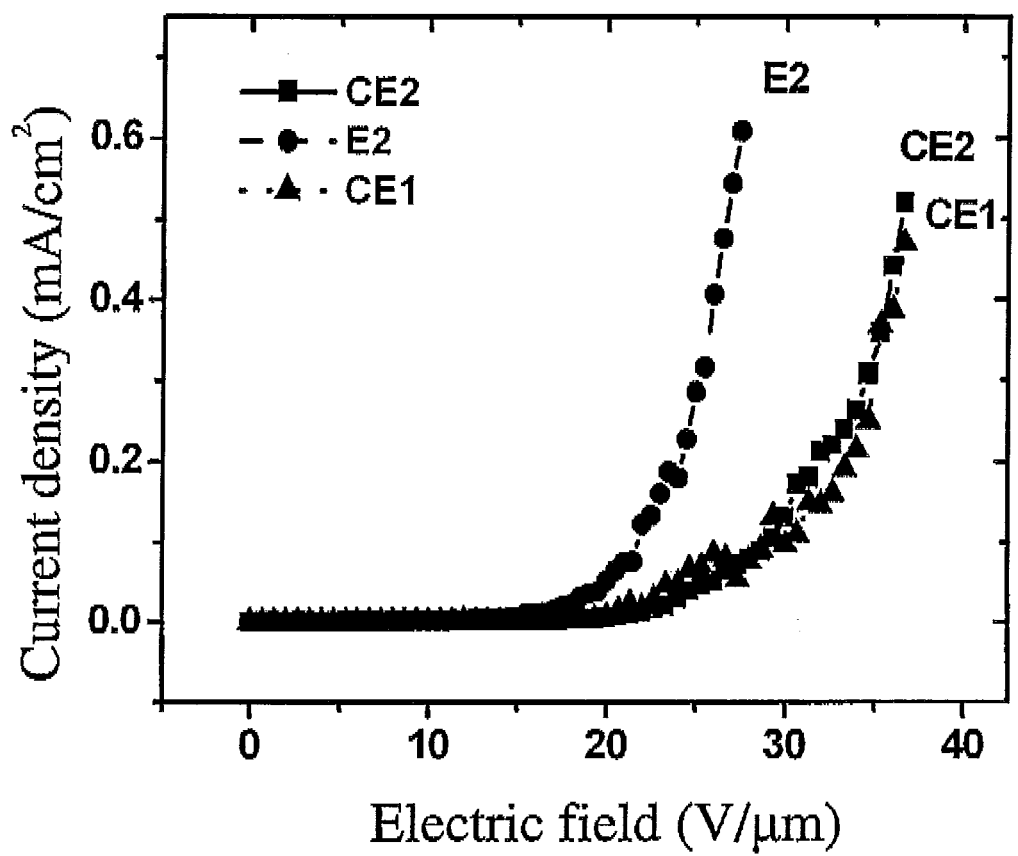
FIG. 6 is J versus E plot illustrating the relations between the current density (J) and the electric field (E) in Example 2, and Comparative Examples 1 and 2.
Figure 7:
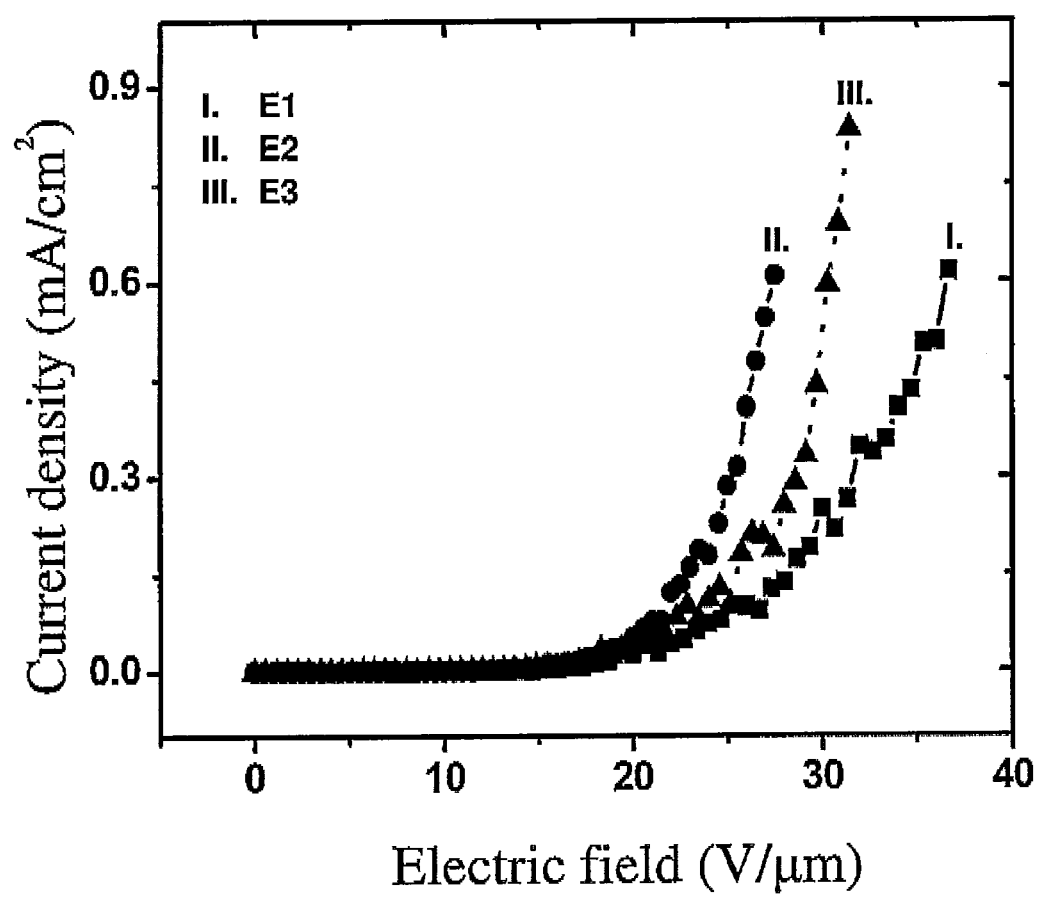
FIG. 7 is a J versus E plot illustrating the relations between the current density (J) and the electric field (E) in Examples 1 to 3 according to this invention.

The field emission properties of the carbon-based composite materials for Examples 1 to 3 and Comparative Examples 1 and 2 are shown in FIGS. 6 and 7.

From the current density (J) versus the electric field (E) plot (J vs. E plot) shown in FIG. 6, the turn-on field ($E_0$) of Example 2 was 6.50 V/μm, and the turn-on fields ($E_0$) of Comparative Examples 1 and 2 were 15.30 V/μm and 12.70 V/μm, respectively.

From the J vs. E plot shown in FIG. 7, the turn-on fields ($E_0$) of Examples 1 to 3 range from 6.50 V/μm to 10.86 V/μm.

The parameters and the field emission properties (i.e., turn-on fields ($E_0$)) of the carbon-based composite materials for Examples 1 to 3 and Comparative Examples 1 and 2 are also shown in Table 1.

TABLE 1

| | The conditions for forming a seeding layer | | The conditions for growing crystal grains | | |
|---|---|---|---|---|---|
| | $CH_4:H_2:Ar$ | Processing time (min) | $CH_4:H_2:Ar$ | Processing time (min) | $E_0$ value (V/μm) |
| CE1 | 4:0:196 | 60 | 1:24:75 | 60 | 15.30 |
| E1 | 4:0:196 | 60 | 1:49:50 | 30 | 10.67 |
| E2 | 4:0:196 | 60 | 1:49:50 | 60 | 6.50 |
| E3 | 4:0:196 | 60 | 1:49:50 | 90 | 10.86 |
| CE2 | 4:0:196 | 60 | 1:74:25 | 60 | 12.70 |

To sum up, the carbon-based composite material of this invention has the continuous graphite phase portion to form the interconnecting channels for transmitting electrons. Besides, with the carbon-based composite material having the continuous nano-graphite clusters formed around the MCD and UNCD grains to serve as emitters for electrical discharge, the turn-on field ($E_0$) can be reduced.

Figure 8:
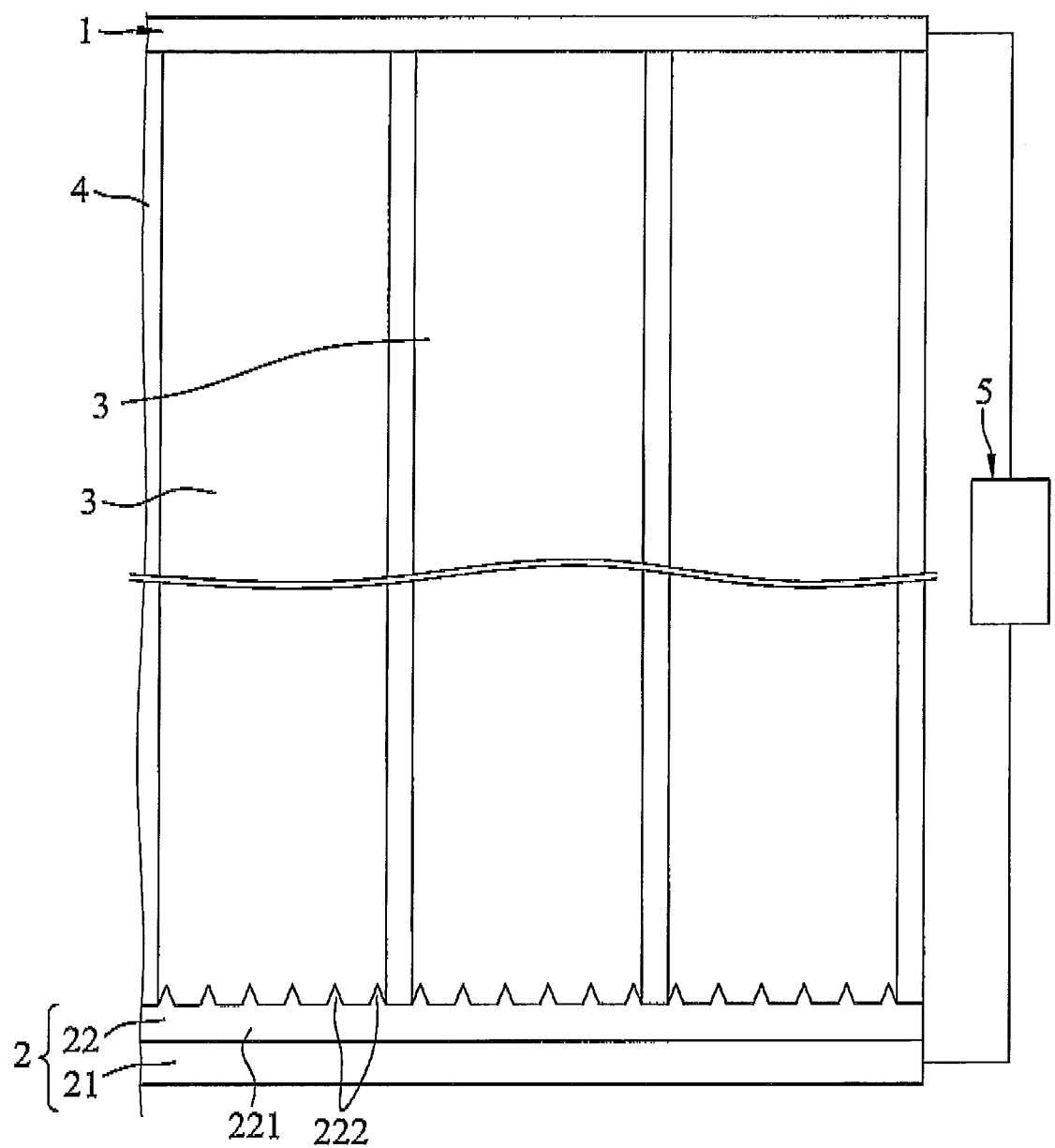
FIG. 8 is a schematic view of the first preferred embodiment of a plasma-generating device according to the present invention.
Figure 9A:
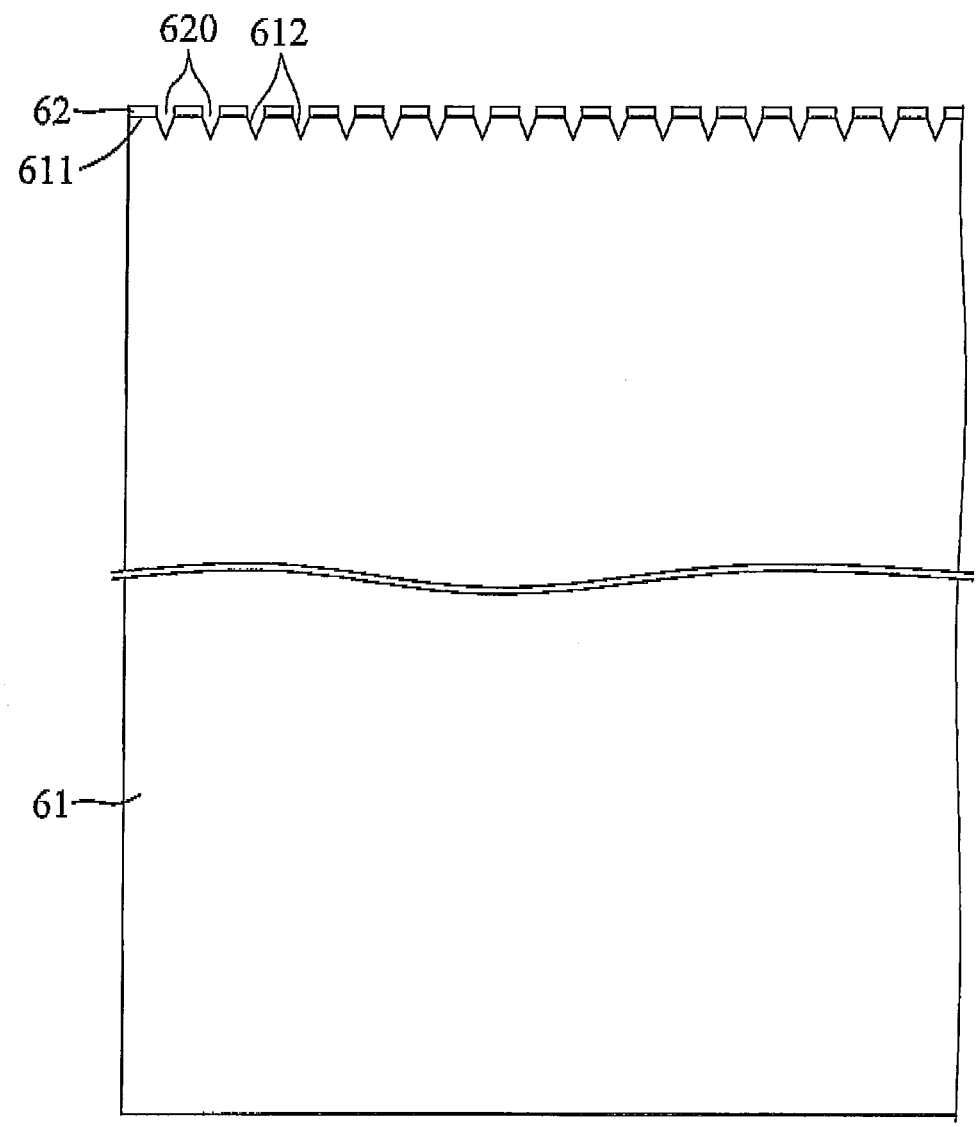
FIGS. 9A to 9E are schematic views illustrating consecutive steps of a method of making the first preferred embodiment of the plasma-generating device according to the present invention.
Figure 9B:
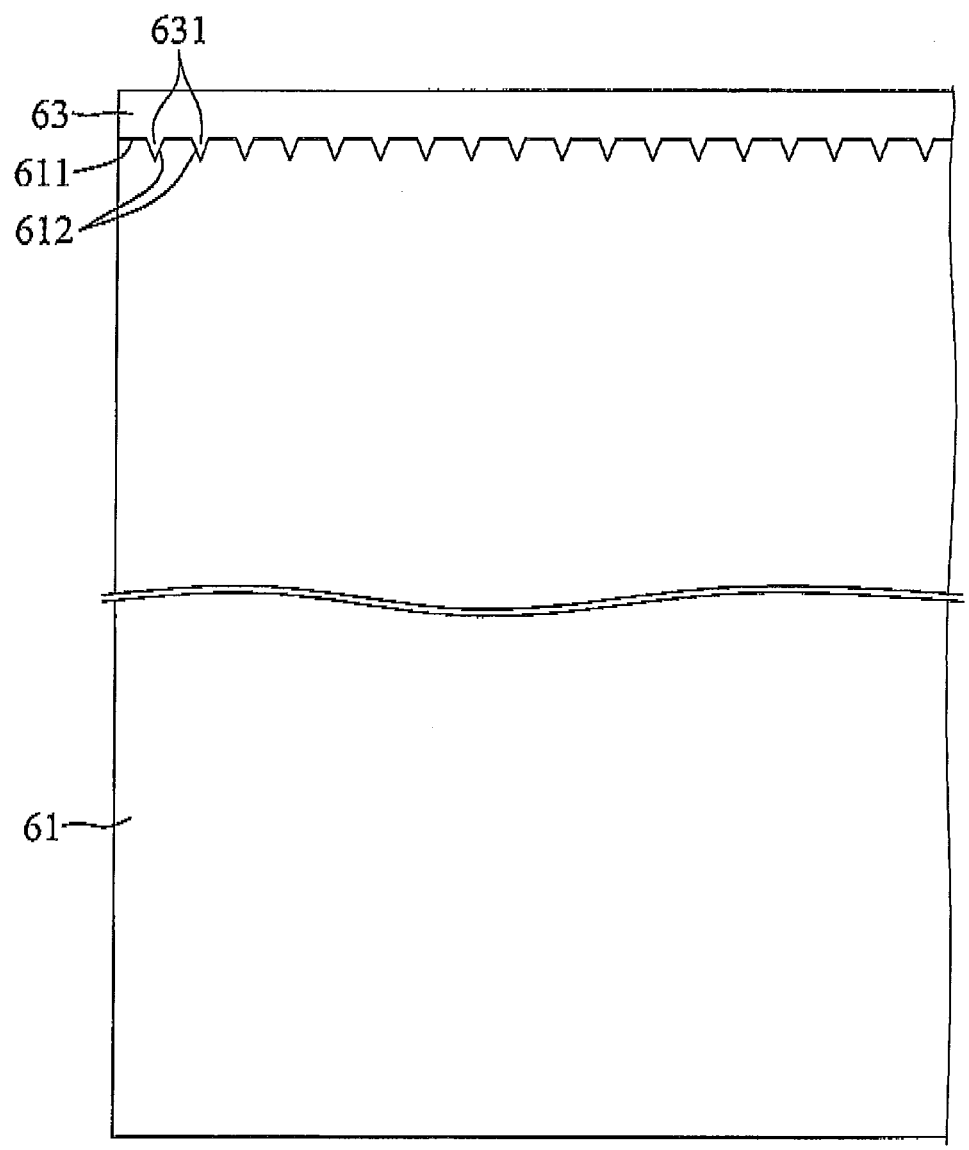
Figure 9C:
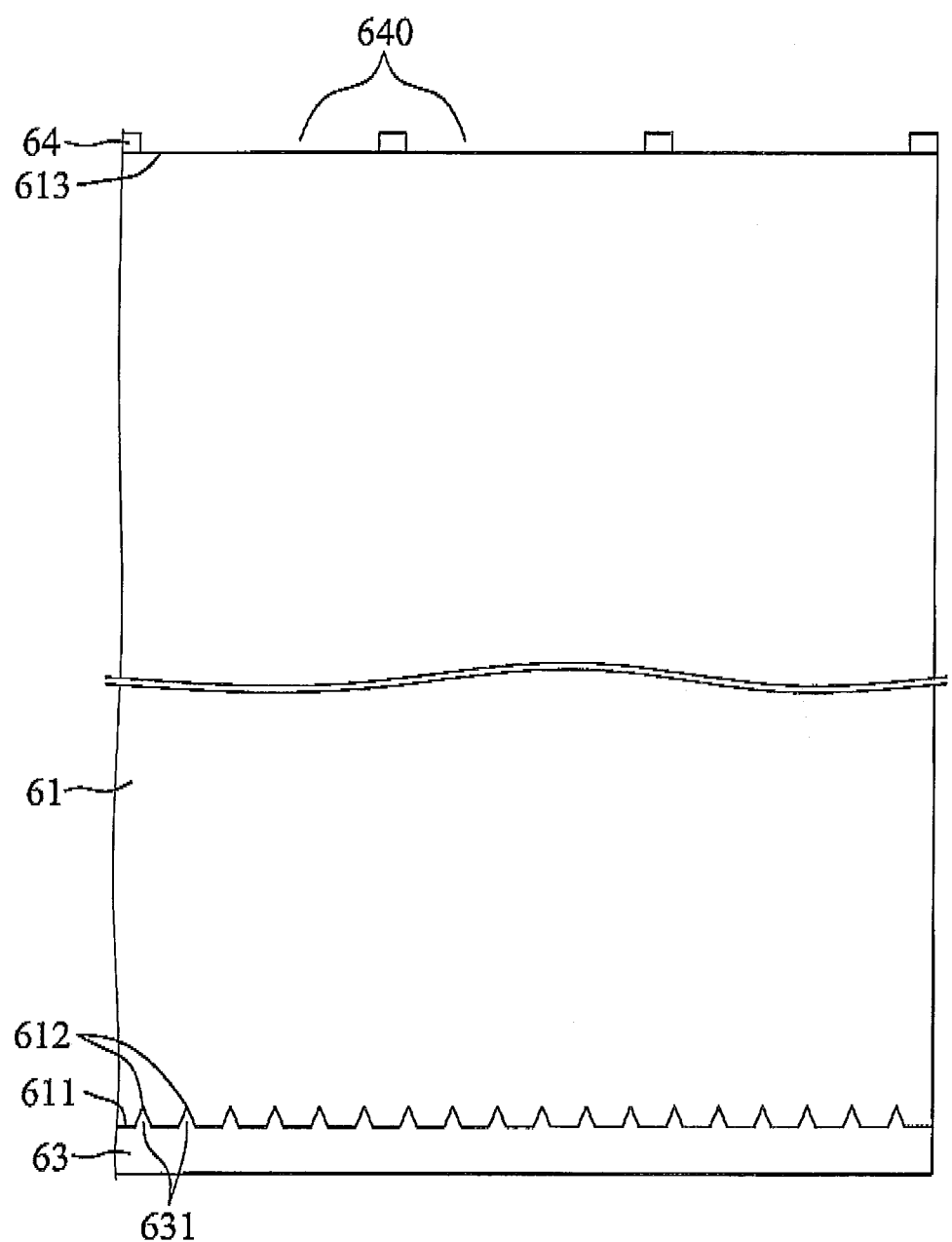
Figure 9D:
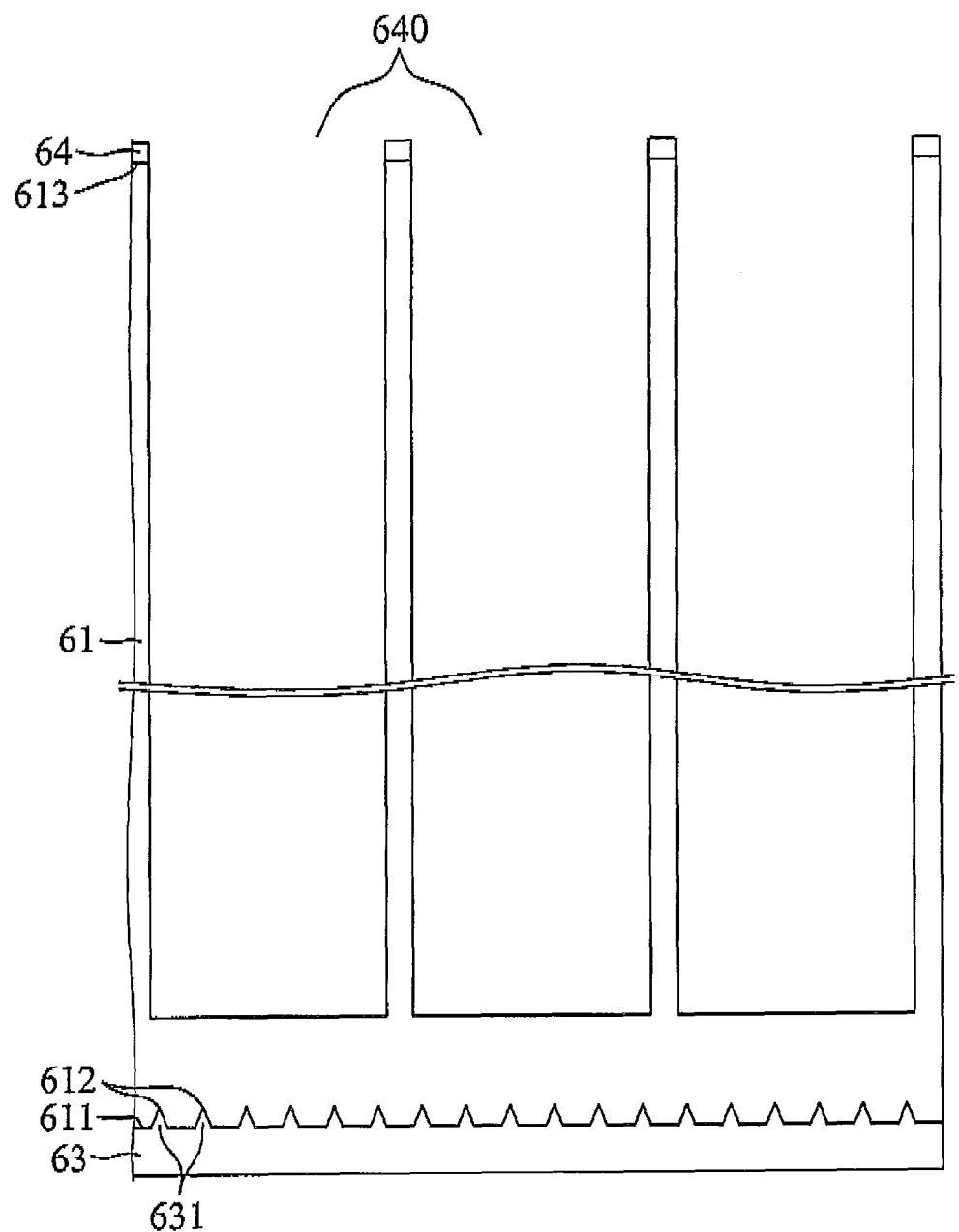
Figure 9E:
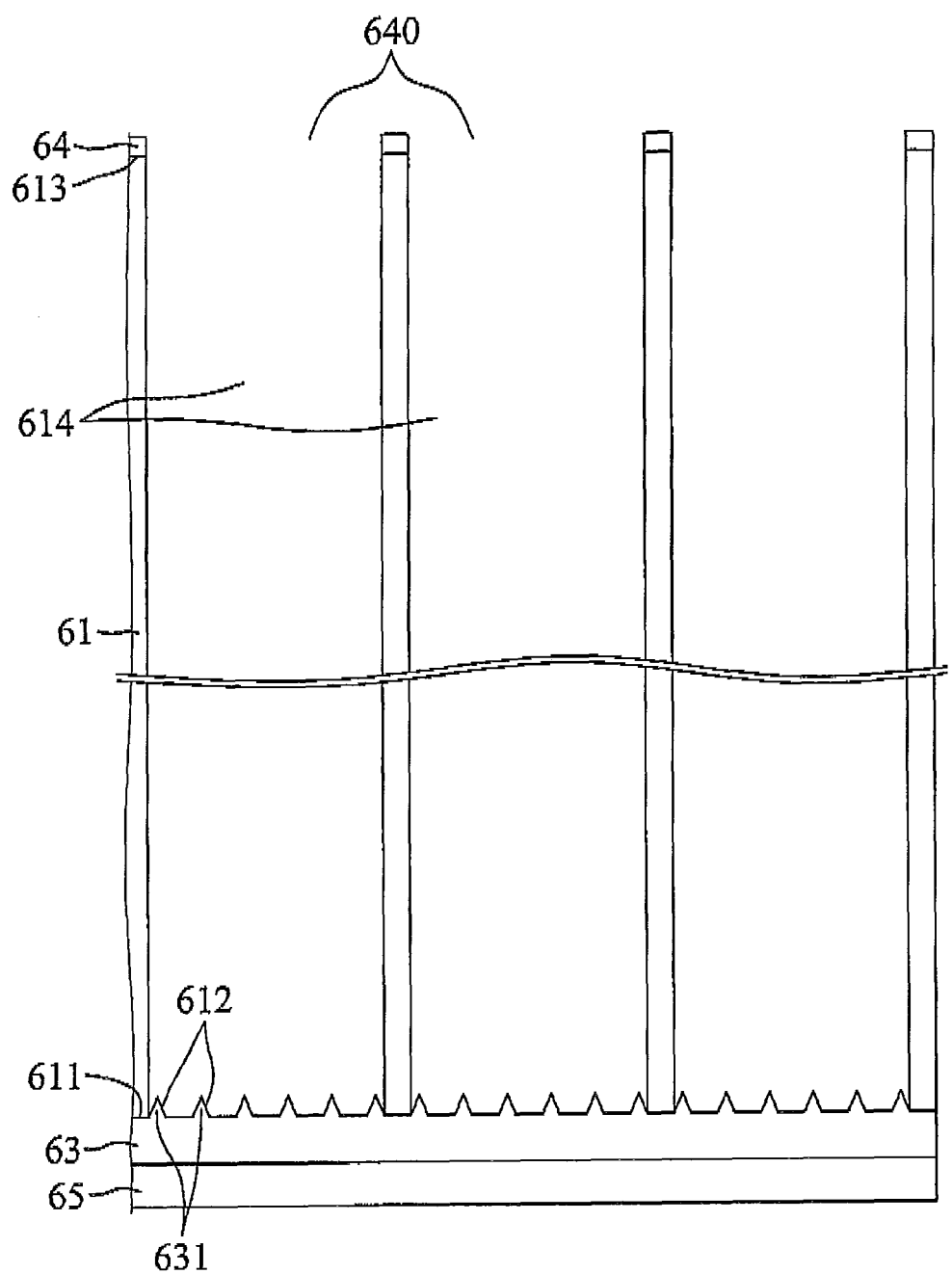

FIG. 8 illustrates the first preferred embodiment of a plasma-generating device according to the present invention. The plasma-generating device is connected to a power source 5, and includes an anode plate 1 and a cathode plate 2 spaced apart from the anode plate 1. The cathode plate 2 includes a substrate 21 and a hybrid diamond layer 22 formed on the substrate 21. The cathode plate 2 and the anode plate 1 are configured to generate plasma therebetween when a pulsed voltage is applied by the power source 5 across the cathode plate 2 and the anode plate 1.

In addition, the plasma-generating device further includes a fixed spacer 4 and an inert gas. The cathode plate 2, the anode plate 1, and the fixed spacer 4 cooperatively define a discharge chamber 3 thereamong. The discharge chamber 3 is filled with the inert gas, and preferably has a pressure not less than 12 Torr for generating plasma.

The hybrid diamond layer 22 includes a base 221 and a plurality of pyramidal nano-tips 222 that protrude from the base 221 toward the anode plate 1. In this embodiment, the hybrid diamond layer 22 is made from a carbon-based composite material that contains a matrix of amorphous carbon, a plurality of micro-crystalline diamond (MCD) grains dispersed in the matrix, a plurality of ultra-nanocrystalline diamond (UNCD) grains dispersed in the matrix, and a graphite phase (which contains a plurality of graphite clusters). More specifically, the amorphous carbon is disposed among and is bonded to the ultra-nanocrystalline diamond grains such that the amorphous carbon is present between every two adjacent ones of the ultra-nanocrystalline diamond grains. The micro-crystalline diamond grains and the graphite phase are disposed among the ultra-nanocrystalline diamond grains, such that the graphite phase is present between each micro-crystalline diamond grain and an adjacent ultra-nanocrystalline diamond grain and that each of the micro-crystalline diamond grains is surrounded by the graphite phase.

The ultra-nanocrystalline diamond grains have an average grain size of less than 10 nm, and the micro-crystalline/diamond grains have an average grain size of greater than 80 nm. Preferably, the nano-crystalline diamond grains have an average grain size less than 5 nm, and the micro-crystalline diamond grains have an average grain size of greater than 100 nm.

FIGS. 9A to 9E illustrate a method of making the cathode plate 2 of the first preferred embodiment of the plasma-generating device. The method of making the first preferred embodiment includes: forming a first mask 62, which is made of $SiO_2$ and which has a plurality of square holes 620 in an array, on a backside 611 of a silicon substrate 61, each of the square holes 620 having a width of 4 μm, the spacing between two adjacent holes 620 being 10 μm; wet etching the silicon substrate 61 from the backside 611 so as to form a plurality of inverted pyramidal notches 612 in an array (see FIG. 9A) in the silicon substrate 61; removing the first mask 62; conducting a first plasma enhanced chemical vapor deposition on the backside 611 of silicon substrate 61 so as to form an UNCD layer as a nucleation layer (not shown) on the silicon substrate 61; conducting a second plasma enhanced chemical vapor deposition on the nucleation layer so as to form an HiD (hybrid diamond) (a mixture of MCD and UNCD) layer 63, that has a plurality of pyramidal nano-tips 631, on the silicon substrate 61 (see FIG. 9B); inverting the silicon substrate 61; forming a second mask 64, which is made of SiN and which has a plurality of circular holes 640 in an array, on a frontside 613 of the silicon substrate 61 (see FIG. 9C); removing a portion of the silicon substrate 61 from the frontside 613 of the silicon substrate 61 using RIE and wet etching techniques, such that the pyramidal nano-tips 631 of the hybrid diamond layer 63 are exposed (see FIGS. 9D and 9E); attaching a copper foil 65 on the backside of the hybrid diamond layer 63 (see FIG. 9E); and removing the second mask 64 from the silicon substrate 61.

Reactant gases used in the first plasma enhanced chemical vapor deposition include $CH_4$ and Ar. The working pressure of the first plasma enhanced chemical vapor deposition is about 120 Torr. Reactant gases used in the second plasma enhanced chemical vapor deposition include $CH_4$, Ar and $H_2$ (1:50:49). The working pressure of the second plasma enhanced chemical vapor deposition is about 60 Torr.

Figure 10:
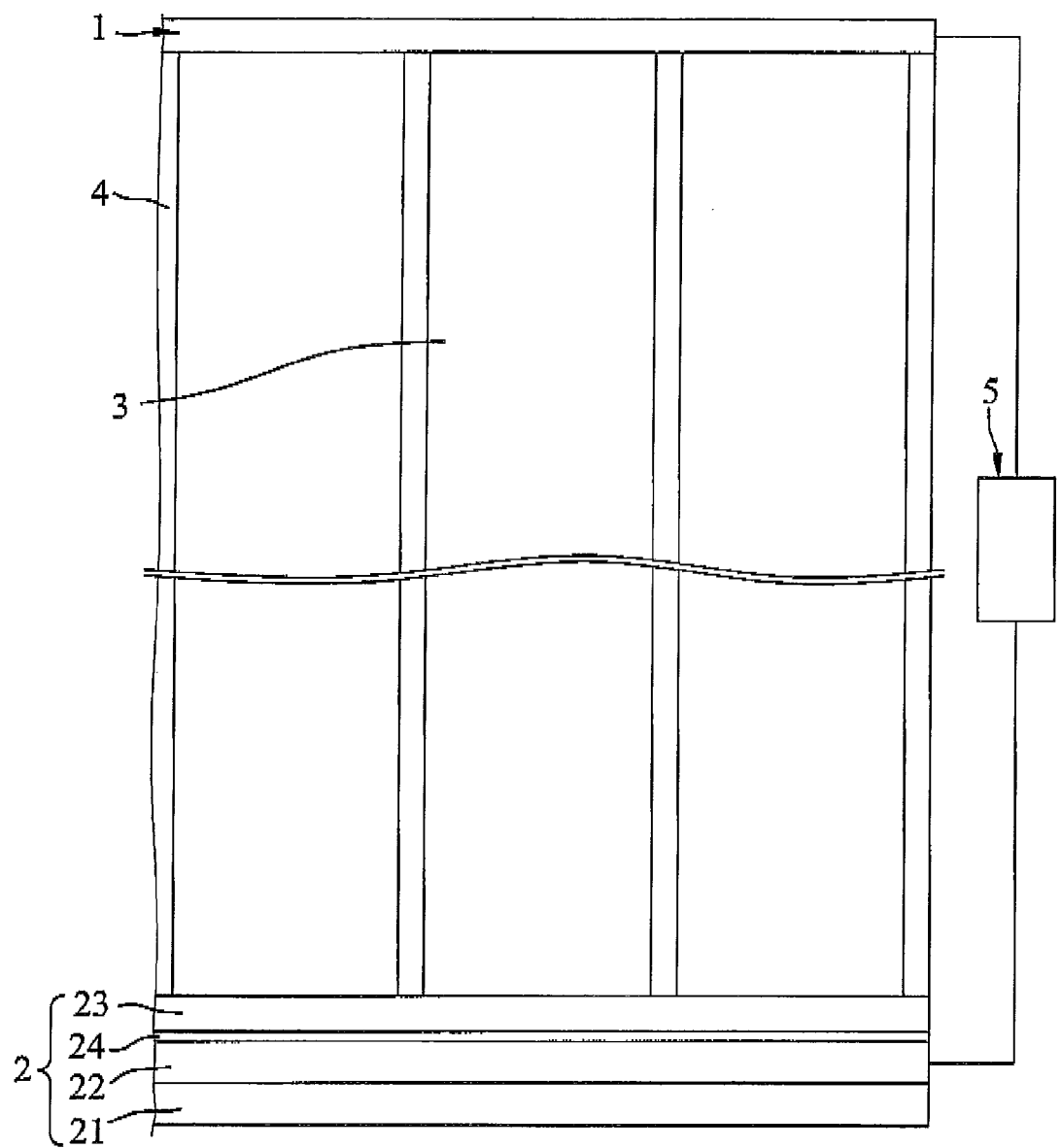
FIG. 10 is a schematic view of the second preferred embodiment of the plasma-generating device according to the present invention.

FIG. 10 illustrates the second preferred embodiment of the plasma-generating device according to the present invention.

The plasma-generating device of the second preferred embodiment is connected to a power source 5, and includes an anode plate 1 and a cathode plate 2 spaced apart from the anode plate 1. The cathode plate 2 includes a substrate 21, a diamond layer 22 (a non-hybrid type) formed on the substrate 21, a metal layer 23 formed on the diamond layer 22, and a graphite precipitate layer 24 formed at an interface between the metal layer 23 and the diamond layer 22. The diamond layer 22 of this embodiment includes a matrix of amorphous carbon and a plurality of micro-crystalline diamond (MCD) grains dispersed in the matrix. The micro-crystal line diamond grains have an average grain size larger than 80 nm.

The cathode plate 2 and the anode plate 1 are configured to generate plasma therebetween when a pulsed voltage is applied by the power source 5 across the cathode plate 2 and the anode plate 1.

Preferably, the metal layer 23 of the cathode plate 2 is made of iron. The cathode plate 2 further includes $Fe_3C$ clusters that are formed at the interface between the metal layer 23 and the diamond layer 22.

The second preferred embodiment of the plasma-generating device may be made by a method including the steps: preparing a p-type silicon substrate 21; forming an MCD film (which defines the diamond layer 22) on the p-type silicon substrate 21 using microwave plasma enhanced chemical vapor deposition (IPLASMA-Cyrannus) techniques; coating a metal layer 23 on the MCD film, which is made of iron, using sputtering techniques; thermal annealing the MCD film and the metal layer 23 at 900° C. in $H_2$ atmosphere for 1 to 10 minutes to cause thermal diffusion of carbon atoms from the MCD film to an interface between the metal layer 23 and the MCD film so as to form the graphite precipitate layer 23 at the interface between the metal layer 23 and the MCD film, the p-type silicon substrate 21 cooperating with the MCD film, the metal layer 23 and the graphite precipitate layer 24 to form the cathode plate 2; coating an indium-tin-oxide (ITO) on a glass substrate so as to form the anode plate 1; forming the fixed spacer 4, which is made of Teflon, between the anode plate 1 and the cathode plate 2 such that the cathode plate 2 is spaced apart from the anode plate 1 by a predetermined spacing; and forming an 8-mm-diameter circular hole in the fixed spacer 4.

Figure 11:
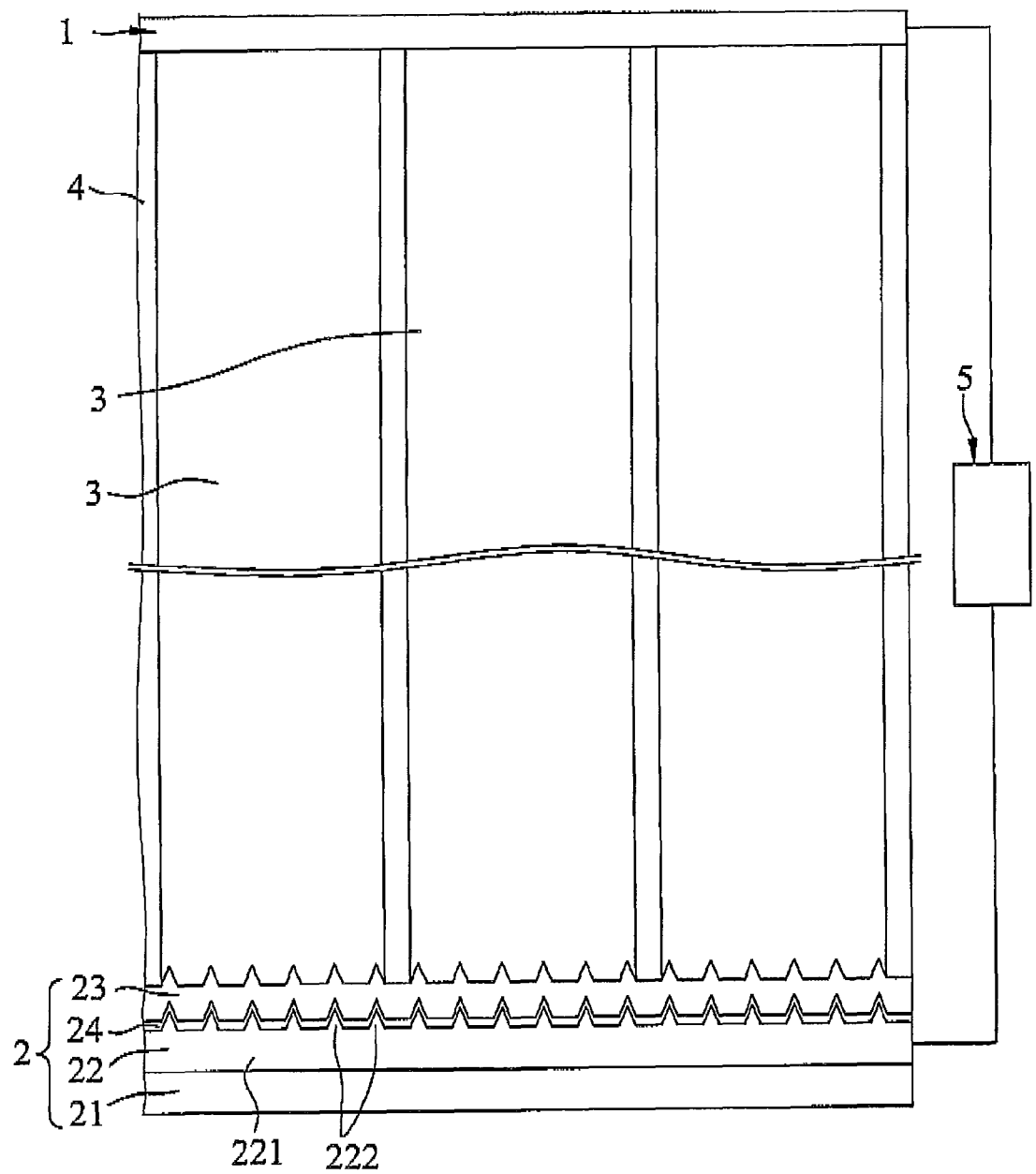
FIG. 11 is a schematic view of the third preferred embodiment of the plasma-generating device according to the present invention.

The second preferred embodiment may be modified in such a manner that the diamond layer 22 is a hybrid type, and is made from a carbon-based composite material that contains a matrix of amorphous carbon, a plurality of micro-crystalline diamond (MCD) grains dispersed in the matrix, a plurality of ultra-nanocrystalline diamond (UNCD) grains dispersed in the matrix, and a graphite phase (which contains a plurality of graphite clusters). FIG. 11 illustrates the third preferred embodiment of the plasma-generating device according to the present invention.

The third preferred embodiment of the plasma-generating device differs from the second preferred embodiment of the plasma-generating device in that the diamond layer 22 of the cathode plate 2 includes a base 221 and a plurality of pyramidal nano-tips 222 that protrude from the base 221 toward the anode plate 1.

[Results and Analysis]

Table 2 shows the performance test results for Example 1 (with a structure of the first preferred embodiment of the plasma-generating device), Example 2 (with a structure of the first preferred embodiment of the plasma-generating device except for the nano-tips 222), and Comparative Example 1 (with a silicone layer but without the hybrid diamond layer 22 as compared to Example 2). The hybrid diamond layer 22 of Examples 1 and 2 contains MCD grains and UNCD grains.

As shown in Table 2, Examples 1 and 2 have an initial turn-on field $E_0$ less than that of Comparative Example 1, and an emission current density $J_e$ greater than that of Comparative Example 1. In addition, the hybrid diamond layer 22 with pyramidal nano-tips 631 has a better performance in terms of electric characteristics.

TABLE 2

| Example | Condition | $E_0$ (V/μm) | $J_e$ (mA/cm$^2$) |
|---|---|---|---|
| Comparative Example 1 | Si cathode | 31.6 | 0.01 |
| Example 1 | Diamond layer (MCD + UNCD) with pyramidal nano-tips | 2.7 | 2.35 |
| Example 2 | Diamond layer (MCD + UNCD) without pyramidal nano-tips | 3.75 | 1.15 |

Table 3 shows the performance test results for Examples 3 to 6 (with a structure of the second preferred embodiment of the plasma-generating device, i.e., with the graphite precipitate layer 24 and the $Fe_3C$ clusters that are formed at the interface between the metal layer 23 and the diamond layer 22) and for Comparative Example 2 (without the graphite precipitate layer 24 and the $Fe_3C$ clusters as compared to the second preferred embodiment of the plasma-generating device). In Table 3, $E_0$ represents an initial turn-on field, $J_e$ represents an emission current density of the cathode plate 2, $E_t$ represents a threshold field to turn on the plasma-generating device, and $J_{plasma}$ represents an emission current density of the plasma-generating device.

It is noted that $E_0$ and $J_e$ in Table 2 were measured using a high-voltage Source-Measurement Unit (Keithly model 237) operated at a pressure of less than $10^{-6}$ Torr, and that the anode plate 1 of each Example is made of molybdenum (Mo). The distance between the anode plate 1 and the cathode plate 2 is 1 μm. Examples 3 to 6 differ from each other in the operating condition of the post thermal annealing.

As shown in Table 3, Examples 3 to 6 have an initial turn-on field $E_0$ less than that of Comparative Example 2, and an emission current density $J_e$ greater than that of Comparative Example 2.

TABLE 3

| Example | Post annealing condition (Temperature/gases/time) | $E_0$ V/μm | $J_e$ mA/cm$^2$ | $E_t$ V/μm | $J_{plasma}$ mA/cm$^2$ |
|---|---|---|---|---|---|
| Comp. Example 2 | — | 4.5 | 36.5 | — | — |
| Example 3 | 900° C./$H_2$ | 3.7 | 111.5 | 0.24 | 6.5 |
| Example 4 | 900° C./$H_2$ + $C_2H_2$ (1 min) | 2.7 | 3390.2 | 0.23 | 7.0 |
| Example 5 | 900° C./$H_2$ + $C_2H_2$ (5 min) | 2.2 | 5327.1 | 0.22 | 8.5 |
| Example 6 | 900° C./$H_2$ + $C_2H_2$ (10 min) | 2.9 | 793.6 | 0.24 | 6.6 |

Table 4 shows the performance test results for Example 7 (with a structure of the second preferred embodiment of the plasma-generating device, i.e., with the graphite precipitate layer 24 and the $Fe_3C$ clusters that are formed at the interface between the metal layer 23 and the hybrid diamond layer 22)

and Comparative Example 3 (with the metal layer 24 but without the graphite precipitate layer and the Fe$_3$C clusters as compared to Example 7).

As shown in Table 4, Example 7 has an initial turn-on field E$_0$ less than that of Comparative Example 3, and an emission current density J$_e$ greater than that of Comparative Example 3.

TABLE 4

| Example | condition | E$_0$ (V/μm) | J$_e$ (mA/cm$^2$) |
|---|---|---|---|
| Comparative Example 3 | Without the graphite precipitate layer | 5.2 | 0.9 |
| Example 7 | With the graphite precipitate layer | 2.8 | 128 |

With the inclusion of the hybrid diamond layer 22 in the cathode plate 2 of the plasma-generating device of the present invention and optionally, with the inclusion of the graphite precipitate layer 24, which is formed at the interface between the metal layer 23 and the diamond layer 22, in the cathode plate 2 of the plasma-generating device of this invention, the emission current density can be increased and the initial turn-on field can be decreased.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A plasma-generating device adapted to be connected to a power source and comprising:
   an anode plate; and
   a cathode plate spaced apart from said anode plate and including a substrate and a hybrid diamond layer that is formed on said substrate;
   wherein said hybrid diamond layer contains a plurality of ultra-nanocrystalline diamond grains, an amorphous carbon disposed among and bonded to said ultra-nanocrystalline diamond grains, a plurality of micro-crystalline diamond grains disposed among said ultra-nanocrystalline diamond grains, and a graphite phase disposed among said ultra-nanocrystalline diamond grains; and
   wherein each of said micro-crystal line diamond grains is surrounded by said graphite phase.

2. The plasma-generating device of claim 1, wherein said cathode plate further includes a metal layer that is formed on said hybrid diamond layer, and a graphite precipitate layer that is formed at an interface between said metal layer and said hybrid diamond layer.

3. The plasma-generating device of claim 2, wherein said metal layer of said cathode plate is made of iron.

4. The plasma-generating device of claim 3, wherein said cathode plate further includes Fe$_3$C clusters that are formed at the interface between said metal layer and said hybrid diamond layer.

5. The plasma-generating device of claim 2, wherein said hybrid diamond layer of said cathode plate includes a base and a plurality of pyramidal nano-tips that protrude from said base toward said anode plate.

6. The plasma-generating device of claim 2, further comprising an inert gas, said cathode plate and said anode plate cooperatively defining a discharge chamber therebetween, said discharge chamber being filled with said inert gas.

7. The plasma-generating device of claim 1, wherein said ultra-nanocrystalline diamond grains have an average grain size of less than 10 nm, and said micro-crystalline diamond grains have an average grain size of greater than 80 nm.

* * * * *